(12) United States Patent
Sellmair et al.

(10) Patent No.: US 7,482,715 B2
(45) Date of Patent: Jan. 27, 2009

(54) SWITCHING VOLTAGE SUPPLY OF VOLTAGE DOMAIN OF SEMICONDUCTOR CIRCUIT

(75) Inventors: Gerald Sellmair, Landshut (DE); Pramod Acharya, Munich (DE)

(73) Assignee: Infineon Technologies AG, Munich (DE)

( * ) Notice: Subject to any disclaimer, the term of this patent is extended or adjusted under 35 U.S.C. 154(b) by 327 days.

(21) Appl. No.: 11/514,799

(22) Filed: Aug. 31, 2006

(65) Prior Publication Data
US 2007/0052470 A1 Mar. 8, 2007

(30) Foreign Application Priority Data
Aug. 31, 2005 (DE) .................. 10 2005 041 295

(51) Int. Cl.
*H01H 7/00* (2006.01)

(52) U.S. Cl. ...................................... 307/141
(58) Field of Classification Search ................ 307/141
See application file for complete search history.

(56) References Cited

FOREIGN PATENT DOCUMENTS

DE 696 23 394 7/2003
DE 10 2004 016 920 10/2005

*Primary Examiner*—Robert L. DeBeradinis
(74) *Attorney, Agent, or Firm*—Dicke, Billig & Czaja, PLLC

(57) ABSTRACT

A method of switching on a voltage supply of a voltage domain of a semiconductor circuit includes switching, initially, a first switchable element, via which elements of the voltage domain are connected to a supply voltage of the semiconductor circuit, to a conductive state. The method includes switching, after a predetermined period of time, a second switchable element, via which elements of the voltage domain are connected to the supply voltage of the semiconductor circuit, to a conductive state. The driving capacity of the first switchable element is less than the driving capacity of the second switchable element.

40 Claims, 2 Drawing Sheets

US 7,482,715 B2

SWITCHING VOLTAGE SUPPLY OF VOLTAGE DOMAIN OF SEMICONDUCTOR CIRCUIT

CROSS-REFERENCE TO RELATED APPLICATIONS

This Utility Patent Application claims priority to German Patent Application No. DE 10 2005 041 295.5, filed on Aug. 31, 2005, which is incorporated herein by reference.

BACKGROUND

The switching-off of unrequired circuit blocks of a semiconductor circuit is an established process for drastically reducing leakage current losses in parts of the circuit which are temporarily unrequired. This process is extremely important, specifically in circuits which are critical with respect to power consumption such as, for example, in baseband circuits, in order to achieve a long standby time. For this purpose, a connection between a local ground of the circuit part to be switched off and the ground of the semiconductor circuit is nowadays usually interrupted using a single switch, such as a large negative metal-oxide semiconductor field effect transistor (NMOSFET) which has a low leakage current and is controlled via a central voltage supply signal. Similar solutions are also possible using a positive metal-oxide semiconductor field effect transistor (PMOSFET) and $V_{DD}$ switching. After switching-off, the inner capacitors of the switched-off circuit blocks are charged to $V_{DD}$. After switching-on again, these capacitors have to be discharged again. During the re-switching-on procedure, uncontrolled switching processes (e.g., glitches, spikes) may occur, which cause, in addition to the discharge current for the capacitors, an additional current on supply lines of the semiconductor circuit. High current peaks should therefore be accommodated for shortly after switching on a circuit block again.

These current peaks, together with the inductors and the resistors of the supply voltage network of the semiconductor circuit, provide an excessive rise and/or fall in the supply voltage (resistive-inductive-capacitive (RLC) oscillator) and also disturb adjacent logic circuits which have not been switched off. However, the switching-off of the voltage supply of a voltage domain can also lead to high voltage peaks, as sudden changes which occur to a current during switching-off lead to voltage peaks, given correspondingly large inductances and low resistive attenuation. It is therefore desirable to monitor and minimize the current and voltage peaks during the switching-on and off of temporarily switched-off circuit blocks.

For these and other reasons, there is a need for the present invention.

SUMMARY

One embodiment provides a method of switching on a voltage supply of a voltage domain of a semiconductor circuit. The method includes switching, initially, a first switchable element, via which elements of the voltage domain are connected to a supply voltage of the semiconductor circuit, to a conductive state. The method includes switching, after a predetermined period of time, a second switchable element, via which elements of the voltage domain are connected to the supply voltage of the semiconductor circuit, to a conductive state. The driving capacity of the first switchable element is less than the driving capacity of the second switchable element.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
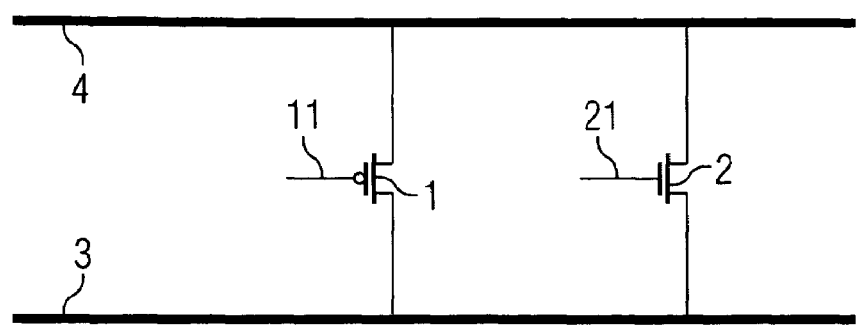
FIG. 1 illustrates two switchable elements which, according to one embodiment, switchably establish a connection between a supply voltage of a semiconductor circuit and a supply voltage of a voltage domain.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of methods and devices switch on and switch off switchable voltage supplies of voltage domains of a semiconductor circuit. One embodiment is a correspondingly constructed semiconductor circuit.

Embodiments of methods and devices are capable of switching on and off a voltage supply of a voltage domain of a semiconductor circuit in such a way that lowers current and voltage peaks compared to conventional methods and devices.

One embodiment of a method switches on a voltage supply of a voltage domain or a circuit part, the supply voltage of which can be switched off, of a semiconductor circuit. In this method embodiment, initially a first switchable element (e.g., a transistor) and a certain period of time later a second switchable element (e.g., a transistor) are switched conductive (i.e., are triggered or switched into a conductive state), the voltage domain being connected to a supply voltage of the semiconductor circuit with these two switchable elements for supplying voltage. The driving capacity of the first switchable element is less than the driving capacity of the second switchable element. In other words, the voltage supply of the voltage domain is switched on using these two switchable elements in that these two switchable elements successively connect the voltage supply of the voltage domain to the supply voltage of the semiconductor circuit.

In one embodiment, as a result of the switchable element having the lower driving capacity being switched on first, current and voltage peaks, which occur immediately after the switching-on of the voltage supply, are kept low, as the current through the first switchable element is limited by the low driving capacity of the first switchable element. The switching-on of the second switchable element having the higher driving capacity ensures that a connection between the voltage domain and the supply voltage of the semiconductor circuit is sufficiently extensive to allow all the parts of the circuit within the voltage domain to operate correctly. During the subsequent switching-on of the second switchable element, no larger current or voltage peaks occur compared to the switching-on of the first switchable element, as the voltage domain is practically switched on in advance by the first switchable element, as a result of which a difference in voltage between the voltage domain (i.e., a voltage domain strip conductor carrying a supply voltage potential) and the supply voltage of the semiconductor circuit is lower than if the first switchable element had not been switched on in advance.

In one embodiment, as the driving capacity of the first switchable element decreases more and more, the differential, in terms of amount, of the potential of the voltage supply of the voltage domain and the potential of the supply voltage of the semiconductor circuit is corresponding smaller. As a result, the formation of current and voltage peaks during switching-on is attenuated more effectively than if the driving capacity of the first switchable element were to remain constant.

In addition, one embodiment of a method for switching on the voltage supply of a voltage domain provides during the switching-on of the voltage supply of the voltage domain, in a first step a differential, in terms of amount, between the potentials of the voltage supply of the voltage domain and the supply voltage of the semiconductor circuit which is not undershot. This embodiment ensures that the voltage supply of the voltage domain is not fully switched on in the first step, as the differential between the potentials of the voltage supply of the voltage domain and the supply voltage of the semiconductor circuit is merely reduced to a certain value greater than zero in the first step and is fully eliminated only in a subsequent step. This feature also ensures that the formation of current and voltage peaks is attenuated more effectively during switching-on.

If the supply voltage to be switched is at $V_{SS}$ or is $V_{SS}$, in one embodiment, the first switchable element is a P-conduction-type transistor and the second switchable element is an N-conduction-type transistor. For switching on the voltage supply, in particular, the control input of the P-conduction-type transistor is activated at $V_{SS}$ and, a certain period of time later, the control input of the N-conduction-type transistor is activated at $V_{DD}$.

In one embodiment, the use of a P-conduction-type transistor as the transistor switched on first has advantages if a ground of the voltage domain is connected to the ground or $V_{SS}$ of the semiconductor circuit, as the conductivity of the P-conduction-type transistor tends to fall compared to an N-conduction-type transistor when the ground of the voltage domain, which may be taken to be at $V_{DD}$ prior to switching-on, approximates $V_{SS}$. The inherent characteristics of the P-conduction-type transistor therefore ensure during switching-on of the voltage supply, if this is $V_{SS}$, that current and voltage peaks are suppressed more effectively than would be the case, for example, with an N-conduction-type transistor. The opposite applies in the case of the transistor switched on second. In one embodiment, it is advantageous to use the N-conduction-type transistor as the transistor switched on second, as its conductivity hardly decreases even if the ground of the voltage domain, due to the switching-on process, is already almost at $V_{SS}$, as a result of which the N-conduction-type transistor optimally ensures that the ground of the voltage domain remains at $V_{SS}$ provided that the voltage supply of the voltage domain is switched on via the two transistors.

If the supply voltage is at $V_{DD}$ or is $V_{DD}$, in one embodiment, the first switchable element is an N-conduction-type transistor and the second switchable element is a P-conduction-type transistor. For switching on the voltage supply, in particular, the control input of the N-conduction-type transistor is activated at $V_{DD}$ and, a certain period of time later, the control input of the P-conduction-type transistor is activated at $V_{SS}$.

For the same reasons as set out above for the case in which the supply voltage is at $V_{SS}$, in one embodiment, it is then advantageous, due to the inherent characteristics of the P-conduction-type and N-conduction-type transistors, for the transistor switched on first to be of the N-conduction type and the subsequently switched transistor to be of the P-conduction type, when the supply voltage is switched to $V_{DD}$.

If the semiconductor circuit comprises not one voltage domain but rather a plurality of voltage domains, the voltage supply of which can be switched, in each case, by a first and a second switchable element, in one embodiment, a first step, switches all of the first switchable elements conductive in succession (i.e., daisy chain), and a second step switches all of the second switchable elements conductive in succession (i.e., daisy chain).

In one embodiment, as a result of all of the first switchable elements of all of the voltage domains being initially switched on in succession, there is automatically a specific period of time between the switching-on of the first and the second switchable element for a certain voltage domain of these voltage domains. In addition, in one embodiment, the successively carried-out switching-on of the first and second switchable elements ensures that the currents flowing through the switchable elements do not in a negative manner add up to form an excessively large simultaneous overall current.

In one embodiment, a voltage domain may also comprise a plurality of regions, each region comprising a first and a second switchable element for switching the voltage supply of the voltage domain. In other words, the voltage domain is connected to a supply voltage of the semiconductor circuit by a plurality of first and a plurality of second switchable elements for supplying voltage. In one embodiment a first step switches all of the first switchable elements conductive in succession (i.e., daisy chain), and a second step switches all of the second switchable elements conductive in succession (i.e., daisy chain).

In one embodiment, as a result, of all of the first switchable elements of all of the regions being initially switched on in succession, there is, similar to the above-described variation of the semiconductor circuit having a plurality of voltage domains, automatically a specific period of time between the switching-on of the first and the second switchable element for a region. In addition, in one embodiment the successively carried-out switching-on of the first and second switchable elements ensures that the currents flowing through the switchable elements do not in a negative manner add up to form an excessively large simultaneous overall current.

In one embodiment, the semiconductor circuit may also comprise a plurality of voltage domains, each voltage domain having in turn a plurality of regions, each region having a first and a second switchable element for switching the voltage supply of the respective voltage domain. In one embodiment, a first step switches all of the first switchable elements conductive in succession, and a second step switches all of the second switchable elements conductive in succession.

One embodiment of a method switches off a voltage supply of a voltage domain of a semiconductor circuit. In this embodiment, as in the method embodiment for switching on a voltage supply, the voltage domain is connected to a supply voltage of the semiconductor circuit by a first and a second switchable element. For switching off the voltage supply, initially the first switchable element (e.g., a transistor) and a predetermined period of time later the second switchable element (e.g., a transistor) are switched non-conductive (i.e., turned off or are switch into a non-conductive state). The driving capacity of the first switchable element is greater than the driving capacity of the second switchable element.

As the largest current and voltage peaks generally occur when the connection of the voltage domain to the supply voltage of the semiconductor circuit is fully interrupted, one embodiment firstly switches off or switch non-conductive the switchable element having the greater driving capacity and then, a specific period of time later fully switches off the voltage supply using the switchable element having the lower driving capacity.

In one embodiment, when the voltage supply of the voltage domain is switched off after a differential, in terms of amount, between the potential of the voltage supply of the voltage domain and the potential of the supply voltage of the semiconductor circuit is achieved, a change speed of the differential, in terms of the amount, between the potentials of the voltage supply of the voltage domain and the supply voltage of the semiconductor circuit is reduced. This means that during switching-off, starting from almost identical potentials of the voltage supply of the voltage domain and the supply voltage of the semiconductor circuit, a certain differential, in terms of amount, of these potentials is initially achieved before a further rise in this differential, in terms of amount, is attenuated.

Due to the inherent characteristics of the P-conduction-type and N-conduction-type transistors, in one embodiment, it is advantageous, in the event of the supply voltage being at $V_{SS}$, for the first transistor, which is switched off first, to be of the N-conduction type and for the second transistor, which is switched off a predetermined period of time after the first transistor, to be of the P-conduction type. In one embodiment, it is advantageous, in the event of the supply voltage being at $V_{DD}$, for the first transistor to be of the P-conduction type and the second transistor to be of the N-conduction type.

As the reasons for the selection of the P-conduction-type and N-conduction-type transistors for the switching-off of the voltage supply are substantially similar to the reasons for the selection of the conduction types for the switching-on of the voltage supply, and these reasons were discussed in detail in the description of the method embodiment for switching on the voltage supply, these reasons will not be repeated here and reference will be made, as appropriate, to the following description of specific embodiments.

One embodiment of a device is configured to switching on a voltage supply of a voltage domain of a semiconductor circuit. The device embodiment comprises a first and a second switchable element, as well as controller. The voltage domain is connected to a supply voltage of the semiconductor circuit using the first and the second switchable elements (e.g., transistors). The controller initially switches the first switchable element, which has a lower driving capacity than the second switchable element, conductive before, after a predetermined period of time, the controller switches the second switchable element conductive.

In addition, one embodiment of a device is configured to switch off a voltage supply of a voltage domain of a semiconductor circuit. Similar to the device embodiment for switching on the voltage supply, the device embodiment for switching off the voltage supply comprises a first and a second switchable element, as well as controller. The voltage domain is connected to the supply voltage of the semiconductor circuit via the first and the second switchable elements (e.g., transistors). The controller initially interrupts a connection between the voltage domain and the supply voltage, which passes via the first switchable element, which has a higher driving capacity than the second switchable element, in that the first switchable element is subjected to high-resistance switching. Then, after a predetermined period of time, the controller switches the second switchable element non-conductive.

Certain advantages of the device embodiment for switching on the voltage supply and of the device embodiment for switching off the voltage supply correspond to the advantages of the method embodiments for switching on and switching off the voltage supply which were described above and will therefore not be repeated here.

One embodiment includes a method and a device for switching on and off a voltage supply of a voltage domain of a semiconductor circuit which are a combination of the corresponding methods and devices for switching on or off a voltage supply of a voltage domain of a semiconductor circuit.

One embodiment is suitable for use in microelectronic circuits supplied by accumulators or batteries such as, for example, laptops or mobile telephones. However, embodiments are not restricted to these fields of application but may rather also be used generally to reduce the power consumption of microelectronic circuits.

FIG. 1 illustrates, according to one embodiment, a supply voltage 4 of a voltage domain of a semiconductor circuit or a strip conductor 4 carrying the supply voltage of the voltage domain and a supply voltage 3 of the semiconductor circuit or a strip conductor 3 carrying the supply voltage of the semiconductor circuit, which are connected to a positive metal-oxide semiconductor (PMOS) transistor 1 and a negative metal-oxide semiconductor (NMOS) transistor 2.

In the first case, assume that the supply voltage 3 of the semiconductor circuit is $V_{SS}$. In this case, the PMOS transistor 1 has a lower driving capacity than the NMOS transistor 2. This may, for example, be achieved in that the W/L ratio (i.e., channel width to channel length ratio) is selected so as to be greater in the NMOS transistor 2 than in the PMOS transistor 1.

Once a voltage domain (not illustrated in FIG. 1), which is supplied by the supply voltage 4, has been switched off for a relatively long time, the potential of the supply voltage 4 of the voltage domain is approximately at $V_{DD}$. If then a control input or gate terminal of the PMOS transistor 1 is activated at $V_{SS}$ in order to switch on the voltage supply of the voltage domain, the gate source voltage of the PMOS transistor is above the operating voltage of the PMOS transistor 1, so the PMOS transistor 1 is switched conductive. As the PMOS transistor 1 is switched conductive, the potential of the supply voltage 4 is drawn more and more to the potential of the supply voltage 3 of the semiconductor circuit (i.e., $V_{SS}$). This reduces the gate source voltage of the PMOS transistor 1 (as the source terminal of the PMOS transistor 1 is regarded as the terminal connected to the supply voltage 4 of the voltage domain) and approximates this operating voltage, as a result of which the conductivity of the PMOS transistor 1 decreases markedly. Any current peaks are thus counteracted. The gate terminal 21 of the NMOS transistor 2 is activated at $V_{DD}$ a predetermined period of time after the gate terminal 11 of the PMOS transistor 1 has been activated at $V_{SS}$. As the source terminal of the NMOS transistor 2 is connected to the supply voltage 3 of the semiconductor circuit (i.e., to $V_{SS}$), the gate source voltage in the NMOS transistor remains above the operating voltage, irrespective of the potential of the supply voltage 4 of the voltage domain, as a result of which the NMOS transistor is at all times switched conductive. This ensures that the supply voltage 4 of the voltage domain is drawn fully to the potential $V_{SS}$ of the supply voltage 3 of the semiconductor circuit.

When the voltage supply of the voltage domain is switched off, the NMOS transistor 2 is initially switched non-conductive in that the gate terminal 21 is activated at $V_{SS}$. A predetermined period of time later, the PMOS transistor 1 is also switched non-conductive in that its gate terminal is activated at $V_{DD}$.

In the second case, assume that the supply voltage 3 of the semiconductor circuit is at $V_{DD}$. In this case, the PMOS transistor 1 has, in accordance with one embodiment, a greater driving capacity than the NMOS transistor 2. Once the voltage domain has been switched off for long enough, the potential of the supply voltage 4 of the voltage domain is approximately at $V_{SS}$. If the gate terminal of the NMOS transistor 2 is then activated at $V_{DD}$, the gate source voltage of the NMOS transistor is above the operating voltage of the NMOS transistor 2, as it is assumed in this case that the source terminal of the NMOS transistor 2 is connected to the supply voltage 4 of the voltage domain. The more the potential of the supply voltage 4 of the voltage domain is drawn to the potential of the supply voltage 3 of the semiconductor circuit (i.e., $V_{DD}$), the more the gate source voltage of the NMOS transistor 2 decreases, thus markedly reducing the conductivity of the NMOS transistor 2. This also counteracts current peaks of the current through the NMOS transistor 1. A predetermined period of time after the switching-on of the NMOS transistor 2, the gate terminal 11 of the PMOS transistor 1 is activated at $V_{SS}$, as a result of which the PMOS transistor 1 is switched conductive. As the gate source voltage of the PMOS transistor 1 is in this case at all times above the operating voltage, since the source terminal of the PMOS transistor 1 is regarded as being connected to the supply voltage 3 of the semiconductor circuit, the gate source voltage of the PMOS transistor 1 does not at any point fall below the operating voltage. This ensures that the PMOS transistor 1 holds the potential of the supply voltage 4 of the voltage domain at the potential of the supply voltage 3 of the semiconductor circuit.

For switching off the supply voltage, the PMOS transistor 1 is initially switched off in that its gate terminal 11 is activated at $V_{DD}$. A predetermined period of time later, the NMOS transistor 2 is also switched off in that its gate terminal 21 is activated at $V_{SS}$.

Figure 4:
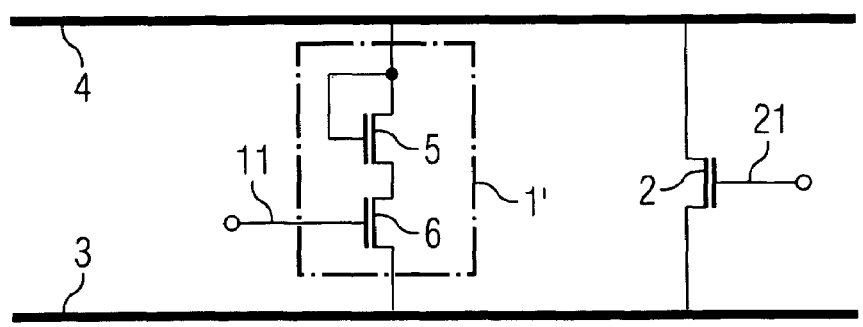
FIG. 4 illustrates one embodiment of a first switchable element.

FIG. 4 illustrates one embodiment of an arrangement which is a variation of the arrangement illustrated in FIG. 1. Reference will therefore be made hereinafter only to the differences and distinctive features of the arrangement of FIG. 4 compared to the arrangement of FIG. 1. In comparison to FIG. 1, in FIG. 4 the supply voltage 4 of the voltage domain and the supply voltage 3 of the semiconductor circuit are connected not to the PMOS transistor 1 but to a switchable element 1' comprising a first NMOS transistor 5 and a second NMOS transistor 6. The drain terminal and the gate terminal of the first NMOS transistor 5 are connected to the supply voltage 4 of the voltage domain, whereas the source terminal of the first NMOS transistor 5 is connected to the drain terminal of the second NMOS transistor 6. The source terminal of the second NMOS transistor 6 is connected to the supply voltage 3 of the semiconductor circuit. The first NMOS transistor 5 therefore operates as a diode.

Assume hereinafter that the supply voltage 3 of the semiconductor circuit is $V_{SS}$. In this case, the switchable element 1' or the NMOS transistors 5, 6 have a lower driving capacity than the NMOS transistor 2. For switching on the supply voltage 4 of the voltage domain, the gate terminal 11 of the second NMOS transistor 6 is activated at $V_{DD}$. The gate source voltage of the second NMOS transistor 6 is therefore above the operating voltage thereof, so the second NMOS transistor 6 is switched conductive. As a result, the potential of the supply voltage 4 is drawn more and more, similar to as in the arrangement of FIG. 1, to the potential of the supply voltage 3 of the semiconductor circuit (i.e., $V_{SS}$). This reduces the gate source voltage of the first NMOS transistor 5, causing the driving capacity or conductivity of the first NMOS transistor 5 to decrease more and more. If the differential between the potential of the supply voltage 4 of the voltage domain and the potential of the supply voltage 3 of the semiconductor circuit is within the range of the operating voltage of the first NMOS transistor 5, the first NMOS transistor 5 is shut off completely. The switchable element 1' in FIG. 4 therefore acts like the PMOS transistor 1 in FIG. 1.

Figure 2:
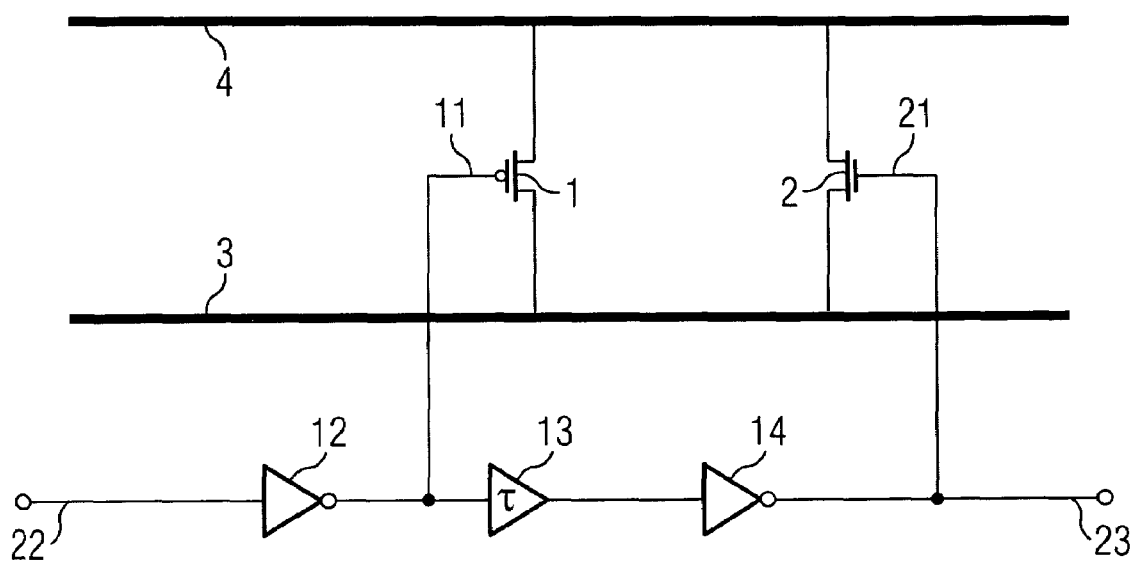
FIG. 2 illustrates one embodiment of a device for switching on or off a voltage supply, the two switchable elements being controlled using a local control logic.

FIG. 2 illustrates one embodiment including, in addition to the PMOS transistor 1 and the NMOS transistor 2, controller, with which the PMOS transistor 1 and the NMOS transistor 2 are activated for switching on or off the supply voltage 4 of the voltage domain. The controller includes a first inverter 12, a delay element 13, and a second inverter 14. An input 22 is connected to the input of the first inverter 12, the output of which is connected to the gate terminal 11 of the PMOS transistor 1 and the input of the delay element 13. The output of the delay element 13 is, in turn, connected to the input of the second inverter 14, the output of which is connected both to the gate terminal 21 of the NMOS transistor 2 and to an output 23. For switching on the voltage supply, the input 22 is activated at $V_{DD}$, so the gate terminal 11 of the PMOS transistor 1 is activated at $V_{SS}$ via the first inverter 12. After a period of time predetermined by the delay element 13, the gate terminal 21 of the NMOS transistor 2 is activated at $V_{DD}$ via the second inverter 14, so both transistors 1, 2 are connected at this moment, as a result of which the voltage supply of the voltage domain is switched on.

For switching-off, the input 22 is activated at $V_{SS}$, so $V_{DD}$ is applied at the gate terminal 11 of the PMOS transistor 1 and, the predetermined period of time later, $V_{SS}$ is applied at the gate terminal 21 of the NMOS transistor 2, as a result of which the voltage supply of the voltage domain is switched off.

In one embodiment, the output 23 may be connected to an input 22 of a device of similar construction for switching on or off a further voltage domain, so simple connection allows an arbitrary number of voltage domains of a semiconductor circuit to be activated.

Figure 3:
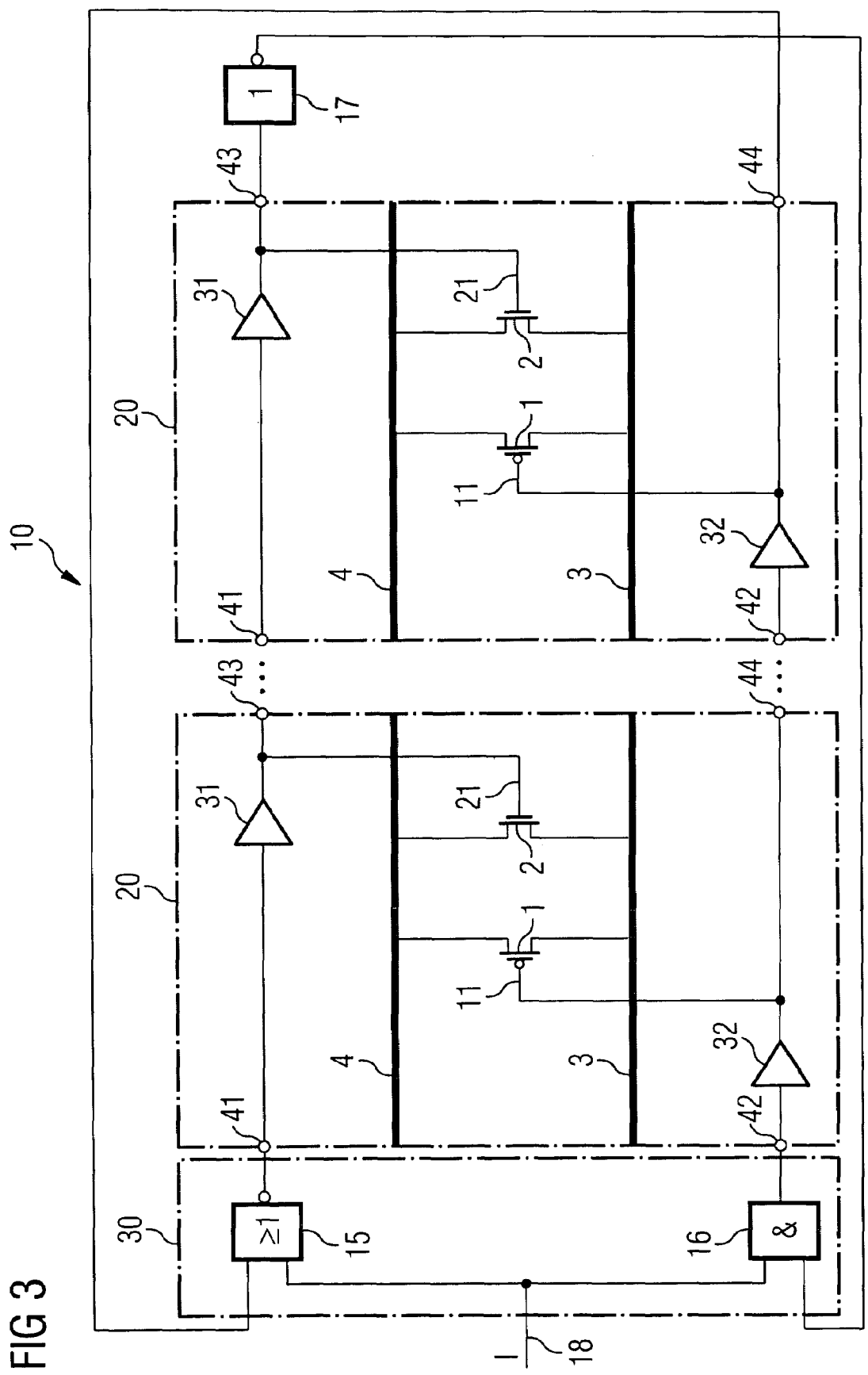
FIG. 3 illustrates one embodiment of a device for switching on and off voltage supplies of a plurality of voltage domains of a semiconductor circuit, the two switchable elements per voltage domain being controlled by controller.

FIG. 3 illustrates one embodiment of a semiconductor circuit 10 comprising a plurality of voltage domains 20. Each voltage domain 20 comprises a first input 41, a second input 42, a first output 43, and a second output 44. In each voltage domain there is arranged a first driver 31, a second driver 32, a PMOS transistor 1, and an NMOS transistor 2 of a device for switching on and off the voltage supply of the voltage domains 20. The first input 41 is connected to the input of the first driver 31, the output of which is connected to the first output 43 and to the gate terminal 21 of the NMOS transistor 2. The second input 42 is connected to the input of the second driver, the output of which is connected to the second output 44 and the gate terminal 11 of the PMOS transistor 1. Similar to as in FIGS. 1 and 2, the PMOS transistor 1 and the NMOS transistor 2 connect the supply voltage 4 of the voltage domain 20 to the supply voltage 3 of the semiconductor circuit 10, which is at $V_{SS}$. As $V_{SS}$ is switched as the supply voltage 4 of the voltage domain 20, the PMOS transistors 1 of the voltage domains 20 have a lower driving capacity than the NMOS transistors 2.

In addition, semiconductor circuit 10 comprises a controller including a NOR gate 15, an AND gate 16, and an inverter 17. A switch signal 18 is connected to a first input of the NOR gate 15 and a first input of the AND gate 16. The output of the NOR gate 15 is connected to the first input 41 of a first of the voltage domains 20, whereas the output of the AND gate 16 is connected to a second input 42 of the first voltage domain 20. The first output 43 of the first voltage domain 20 is connected to the first input 41 of a next voltage domain 20, the first output 43 of which is, again, connected to the first input 41 of a next voltage domain 20 but one, etc. The first output 43 of a final voltage domain 20 is coupled back to a second input of the AND gate 16 via the inverter 17. Similarly, the second output 44 of the first voltage domain 20 is coupled to the second input 42 of the next voltage domain 20, the second output 44 of which is connected to the second input 42 of the next voltage domain 20 but one, etc., the second output 44 of the final voltage domain 20 being coupled back to a second input of the NOR gate 15.

Assume that the value of the switch signal 18 is at 1 or $V_{DD}$, meaning that the voltage supply of the voltage domains is interrupted or switched off. The voltage supply of the voltage domains 20 is then switched on in that the value of the switch signal 18 is adjusted to 0 or $V_{SS}$. A 0 is therefore also obtained at the output of the AND gate 16, as a result of which the gate terminal 11 of the PMOS transistor 1 of the first voltage domain 20 is activated at $V_{SS}$, causing the potential of the supply voltage 4 of the first voltage domain 20 slowly to be drawn to $V_{SS}$, without causing current or voltage peaks. The value 0 is, in each case, successively forwarded to the following voltage domains 20 via the second driver 32 and the second output 44, the PMOS transistor 1 being switched conductive in succession, in the manner of a daisy chain, in the voltage domains 20, so the switching-on of the supply voltage 4 of each voltage domain 20 is commenced. The value 0 is coupled back to the NOR gate 15 via the second output 44 of the final voltage domain 20, so the value 0 is then applied at both outputs of the NOR gate 15. The value at the output of the NOR gate 15 therefore becomes the value 1, and this activates at $V_{DD}$ the gate terminal 21 of the NMOS transistor 2 via the first driver 31 of the first voltage domain 20, as a result of which the voltage supply 4 of the first voltage domain 20 is fully switched on. Just as the value 0 is successively forwarded to the voltage domains 20 via the respective second drivers 32, the value 1 is then successively forwarded, in the manner of a daisy chain, via the first drivers 31 of the voltage domains 20, so that the NMOS transistors 2 of the voltage domain 20 are switched conductive in succession, as a result of which the supply voltage 4 of the voltage domains 20 is fully switched on in succession. Finally, the value 1 is inverted to the value 0 by the inverter 17, via the first output of the final voltage domain 20, and coupled back to the second input of the AND gate 16, as a result of which the controller or the device assume their final condition during switch-off.

For switching off the voltage supply of the voltage domains 20, the value of the switch signal 18 is set from the value 0 to the value 1. This causes the value at the output of the NOR gate 15 to flip from 1 to 0, as a result of which the gate terminal 21 of the NMOS transistor 2 of the first voltage domain 20 is activated at $V_{SS}$ via the first driver 31, causing the NMOS transistor 2 to be shut off. As it may be assumed that both the supply voltage 4 of the voltage domain 20 and the supply voltage 3 of the semiconductor circuit 10 are at this moment at $V_{SS}$, the PMOS transistor 1 is also shut off, so to begin with the voltage supply of the voltage domain is completely interrupted. Only when a differential between the supply voltage 4 of the voltage domain 20 and the supply voltage 3 of the semiconductor circuit 10 is greater than the operating voltage of the PMOS transistor 1 is the PMOS transistor 1 continuous again, in order to attenuate the transient behavior when the voltage supply of the voltage domain 20 is switched off.

The value 0 is then successively forwarded to the following voltage domains 20 via the first outputs 43, first inputs 41 and first drivers 31, as a result of which the respective NMOS transistors 2 are switched off and the above-described described behaviour of the corresponding PMOS transistors 1 occurs. The value 0 of the first output 43 of the final voltage domain 20 is then directed in inverted form to the second input of the AND gate 16 via the inverter 17, as a result of which the value at the output of the AND gate 16 becomes the value 1. The value 1 is then successively forwarded to all of the voltage domains 20 via the drivers 32, causing all of the PMOS transistors of the voltage domains 20 to be successively activated at $V_{DD}$, as a result of which the PMOS transistor 1 and the voltage supply of each voltage domain 20 is finally fully switched off. Finally, the value 1 is coupled back to the second input of the NOR gate via the second output 44 of the final voltage domain 20, as a result of which the control means or the device according to the embodiment of the invention reach their final condition during switch-off.

In one embodiment, the controller is constructed in such a way that the final switching-off of one of the PMOS transistors 1 does not take place until the operating voltage of the respective PMOS transistor 1 has again been achieved (i.e., the respective PMOS transistor 1 is switched conductive).

The embodiment of the device illustrated in FIG. 3 for switching on and off the voltage supply of voltage domains 20 performs the separation or reconnection of the supply voltage 4 of the individual voltage domains 20 from or to the supply voltage 3 of the semiconductor circuit in a particularly elegant and unproblematic manner, wherein the device takes up little surface area. It is, for example, easily possible in other embodiments, to integrate further voltage domains, constructed in the same manner as the illustrated voltage domains (construction and connection of the drivers 31, 32 and transistors 1, 2), in such a way that they can also be switched on and off using the same mechanism. For this purpose, the connections between the first/second output of a specific voltage domain and the first/second input of a voltage domain adjacent to the specific voltage domain have merely to be separated and the voltage domain to be integrated for the first time has merely to be integrated in such a way that its first/second input is connected to the first/second output of the specific voltage domain and its first/second output is connected to the first/second input of the voltage domain adjacent to the specific voltage domain.

Note that the principle, illustrated in the embodiment of FIG. 3, of the activation of voltage domains may also in other embodiments be used if the supply voltage to be switched on is $V_{DD}$. In this case, the NOR gate 15 may be replaced by an OR gate and the AND gate 16 by a NAND gate. In this case, the inverter 17 is additionally coupled on the input side to the second output 44 of the final voltage domain 20, so that its output is connected to the second input of the OR gate and the first output 43 of the final voltage domain 20 is coupled directly to the second input of the NAND gate. When the supply voltage $V_{DD}$ is switched on and off, the PMOS transistor 1 then has, in accordance with embodiments, a higher driving capacity than the NMOS transistor 2 in each voltage domain 20.

One embodiment of a device, based on the principle, for switching a supply voltage $V_{SS}$, like that illustrated in FIG. 3, may have, instead of the NOR gate 15, an AND gate and, instead of the AND gate 16, a NOR gate, the first output 43 of the final voltage domain being coupled back directly to the second input of the NOR gate and the second output 44 of the final voltage domain being coupled back, inverted by the inverter 17, to the second input of the AND gate. In a device embodiment constructed in this manner, the switch signal 18 has, for switching on the voltage supply, the value 1 or $V_{DD}$ and, for switching-off, the value 0 or $V_{SS}$.

Also, note that the device embodiment described above, but not explicitly illustrated, for switching the supply voltage $V_{DD}$ may also, in another embodiment, include, instead of the OR gate, a NAND gate and, instead of the NAND gate, an OR gate. In this case, the first output 43 of the final voltage domain is connected to the input of the inverter 17 and the output of the inverter 17 is coupled back to the second input of the OR gate, whereas the second output of the final voltage domain is coupled back directly (i.e., not in inverted form) to the second input of the NAND gate. For this purpose, the switch signal 18 is set, for switching on the voltage supply of the voltage domains, to the value 1 or $V_{DD}$ and, for switching-off, to the value 0 or $V_{SS}$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of switching on a voltage supply of a voltage domain of a semiconductor circuit, the method comprising:
   switching, initially, a first switchable element, via which elements of the voltage domain are connected to a supply voltage of the semiconductor circuit, to a conductive state; and
   switching, after a predetermined period of time, a second switchable element, via which elements of the voltage domain are connected to the supply voltage of the semiconductor circuit, to a conductive state, wherein the driving capacity of the first switchable element is less than the driving capacity of the second switchable element.

2. The method according to claim 1, wherein the driving capacity of the first switchable element decreases more and more as the potential of the voltage supply of the voltage domain increasingly approximates the potential of the supply voltage of the semiconductor circuit.

3. The method according to claim 1, wherein, when the voltage supply of the voltage domain is switched on in a first step, a predetermined amount of a differential between the potential of the voltage supply of the voltage domain and the potential of the supply voltage of the semiconductor circuit is not undershot, the predetermined amount being less than the amount of a differential between the potential of the voltage supply of the voltage domain and the potential of the supply voltage of the semiconductor circuit when the voltage domain is fully switched on.

4. The method according to claim 1, wherein the supply voltage is at $V_{SS}$, the first switchable element is a P-conduction-type transistor, and the second switchable element is an N-conduction-type transistor.

5. The method according to claim 4, wherein, for switching on the voltage supply, the method comprises:
   activating at $V_{SS}$ the control input of the P-conduction-type transistor; and
   activating at $V_{DD}$, after the predetermined period of time, the control input of the N-conduction-type transistor.

6. The method according to claim 1, wherein the supply voltage is at $V_{DD}$, the first switchable element is an N-conduction-type transistor, and the second switchable element is a P-conduction-type transistor.

7. The method according to claim 6, wherein, for switching on the voltage supply, the method comprises:
   activating at $V_{DD}$ the control input of the N-conduction-type transistor; and
   activating at $V_{SS}$, after the predetermined period of time, the control input of the P-conduction-type transistor.

8. The method according to claim 1, wherein the voltage domain comprises a plurality of regions, each region comprising a first switchable element and a second switchable element for switching on the voltage supply of the voltage domain, and wherein the method comprises:
   switching, initially, all of the first switchable elements to a conductive state in succession; and
   switching, after a predetermined period of time, all of the second switchable elements to a conductive state in succession.

9. A method of switching on a voltage supply of a plurality of voltage domains of a semiconductor circuit, wherein each voltage domain comprises a first switchable element and a second switchable element, the method comprising:
   switching, initially, all of the first switchable elements to a conductive state in succession; and
   switching, after a period of time, all of the second switchable elements to a conductive state in succession, wherein the driving capacity of the first switchable elements are less than the driving capacity of the second switchable elements.

10. The method according to claim 9, wherein the driving capacities of the first switchable elements decrease more and more as the corresponding potential of the voltage supply of the corresponding voltage domain increasingly approximates the potential of the supply voltage of the semiconductor circuit.

11. A method of switching off a voltage supply of a voltage domain of a semiconductor circuit, the method comprising:
   switching, initially, a first switchable element, via which elements of the voltage domain are connected to a supply voltage of the semiconductor circuit, to a non-conductive state; and
   switching, after a predetermined period of time, a second switchable element, via which elements of the voltage domain are connected to the supply voltage of the semiconductor circuit, to a non-conductive state, wherein the driving capacity of the first switchable element is greater than the driving capacity of the second switchable element.

12. The method according to claim 11, wherein the driving capacity of the second switchable element increases more and more, the greater the amount is of a differential between the potential of the voltage supply of the voltage domain and the potential of the supply voltage of the semiconductor circuit.

13. The method according to claim 11, wherein, when the voltage supply of the voltage domain is switched off after a predetermined amount of a differential between the potential of the voltage supply of the voltage domain and the potential of the supply voltage of the semiconductor circuit is achieved, a change speed of an amount of the differential between the potential of the voltage supply of the voltage domain and the potential of the supply voltage of the semiconductor circuit is reduced, the predetermined amount being less than the amount of the differential between the potential of the voltage supply of the voltage domain and the potential of the supply voltage of the semiconductor circuit before the voltage domain is switched off.

14. The method according to claim 11, wherein the supply voltage is at $V_{SS}$, the first switchable element is an N-conduction-type transistor, and the second switchable element is a P-conduction-type transistor.

15. The method according to claim 14, wherein, for switching off the voltage supply, the method comprises:
    activating at a reference potential the control input of the N-conduction-type transistor; and
    activating at $V_{DD}$, after the predetermined period of time, the control input of the P-conduction-type transistor.

16. The method according to claim 11, wherein the supply voltage is at $V_{DD}$, the first switchable element is a P-conduction-type transistor, and the second switchable element is an N-conduction-type transistor.

17. The method according to claim 16, wherein, for switching off the voltage supply, the method comprises:
    activating at $V_{DD}$ the control input of the P-conduction-type transistor; and
    activating at $V_{SS}$, after the predetermined period of time, the control input of the N-conduction-type transistor.

18. The method according to claim 11, wherein the voltage domain comprises a plurality of regions, each region comprising a first switchable element and a second switchable for switching off the voltage supply of the voltage domain, and wherein, the method comprises:
    switching, initially, all of the first switchable elements to a non-conductive state in succession; and
    switching, after a predetermined period of time, all of the second switchable elements to a non-conductive state in succession.

19. A method of switching off a voltage supply of a plurality of voltage domains of a semiconductor circuit, wherein each voltage domain comprises a first switchable element and a second switchable element, the method comprising:
    switching, initially, all of the first switchable elements to a non-conductive state in succession; and
    switching, after a period of time, all of the second switchable elements to a non-conductive state in succession, wherein the driving capacity of the first switchable elements are greater than the driving capacity of the second switchable elements.

20. The method according to claim 19, wherein the driving capacities of the second switchable elements increase more and more, the greater the corresponding amount is of a differential between the potential of the voltage supply of the corresponding voltage domain and the potential of the supply voltage of the semiconductor circuit.

21. A device configured to switch on a voltage supply of a voltage domain of a semiconductor circuit, the device comprising:
    a first switchable element configured to connect the voltage domain to a supply voltage of the semiconductor circuit;
    a second switchable element configured to connect the voltage domain to the supply voltage of the semiconductor circuit, wherein the driving capacity of the first switchable element is less than the driving capacity of the second switchable element; and
    a controller configured to initially control the first switchable element to switch to a conductive state and to, after a predetermined period of time, control the second switchable element to switch to a conductive state.

22. The device according to claim 21, wherein the first switchable element is configured to have a driving capacity that decreases more and more as the potential of the voltage supply of the voltage domain increasingly approximates the potential of the supply voltage of the semiconductor circuit.

23. The device according to claim 21, wherein the first switchable element is configured such that, after the continuous switching of the first switchable element in a first step, a predetermined amount of a differential between the potential of the voltage supply of the voltage domain and the potential of the supply voltage of the semiconductor circuit is not undershot, the predetermined amount being less than the amount of a differential between the potential of the voltage supply of the voltage domain and the potential of the supply voltage of the semiconductor circuit when the voltage domain is fully switched on.

24. The device according to claim 21, wherein the supply voltage is at $V_{SS}$, the first switchable element is a P-conduction-type transistor, and the second switchable element is an N-conduction-type transistor.

25. The device according to claim 24, wherein the controller is configured to switch on the voltage supply, activate at $V_{SS}$ the control input of the P-conduction-type transistor, and, after the predetermined period of time, activate at $V_{DD}$ the control input of the N-conduction-type transistor.

26. The device according to claim 21, wherein the supply voltage is at $V_{DD}$, the first switchable element is an N-conduction-type transistor, and the second switchable element is a P-conduction-type transistor.

27. The device according to claim 26, wherein the controller is configured to switch on the voltage supply, activate at $V_{DD}$ the control input of the N-conduction-type transistor, and, after the predetermined period of time, activate at $V_{SS}$ the control input of the P-conduction-type transistor.

28. The device according to claim 21, wherein the voltage domain comprises a plurality of regions, each region comprising a first switchable element and a second switchable element for switching on the voltage supply of the voltage domain, and wherein the controller is configured to initially control all of the first switchable elements to switch to a conductive state in succession and to, after a predetermined period of time, control all of the second switchable elements to switch to a conductive state in succession.

29. A device for switching on a voltage supply of a plurality of voltage domains of a semiconductor circuit, the device comprising:
    a first switchable element and a second switchable element for each voltage domain, via which each voltage domain is connected to a supply voltage of the semiconductor circuit, wherein the driving capacity of the first switchable elements are less than the driving capacity of the second switchable elements; and
    means for initially controlling all of the first switchable elements to switch to a conductive state in succession, and for controlling, after a period of time, all of the second switchable elements to switch to a conductive state in succession.

30. The device according to claim 29, wherein the first switchable elements are configured to have driving capacities that decrease more and more as the corresponding potential of the voltage supply of the corresponding voltage domain increasingly approximates the potential of the supply voltage of the semiconductor circuit.

31. A device configured to switching off a voltage supply of a voltage domain of a semiconductor circuit, the device comprising:
   a first switchable element configured to connect the voltage domain to a supply voltage of the semiconductor circuit;
   a second switchable element configured to connect the voltage domain to the supply voltage of the semiconductor circuit, wherein the driving capacity of the first switchable element is greater than the driving capacity of the second switchable element; and
   a controller configured to initially control the first switchable element to switch to a non-conductive state and to, after a predetermined period of time, control the second switchable element to switch to a non-conductive state.

32. The device according of claim 31, wherein the second switchable element is configured to have a driving capacity that increases more and more, the greater the amount is of a differential between the potential of the voltage supply of the voltage domain and the potential of the supply voltage of the semiconductor circuit.

33. The device according to claim 31, wherein the second switchable element is configured such that, before the controller controls the switching of the second switchable element to the non-conductive state, after a predetermined amount of a differential between the potential of the voltage supply of the voltage domain and the potential of the supply voltage of the semiconductor circuit is achieved, a change speed of an amount of the differential between the potential of the voltage supply of the voltage domain and the potential of the supply voltage of the semiconductor circuit is reduced, the predetermined amount being less than the amount of the differential between the potential of the voltage supply of the voltage domain and the potential of the supply voltage of the semiconductor circuit before the voltage domain is switched off.

34. The device according to claim 31, wherein the supply voltage is at $V_{SS}$, the first switchable element is an N-conduction-type transistor, and the second switchable element is a P-conduction-type transistor.

35. The device according to claim 34, wherein the controller is configured to switch off the voltage supply, activate at $V_{SS}$ the control input of the N-conduction-type transistor, and, after the predetermined period of time, activate at $V_{DD}$ the control input of the P-conduction-type transistor.

36. The device according to claim 31, wherein the supply voltage is at $V_{DD}$, the first switchable element is a P-conduction-type transistor, and the second switchable element is an N-conduction-type transistor.

37. The device according to claim 36, wherein the controller is configured to switch off the voltage supply, activate at $V_{DD}$ the control input of the P-conduction-type transistor, and, after the predetermined period of time, activate at $V_{SS}$ the control input of the N-conduction-type transistor.

38. The device according to claim 31, wherein the voltage domain comprises a plurality of regions, each region comprising a first switchable element and a second switchable element for switching off the voltage supply of the voltage domain, and wherein the controller is configured to initially control all of the first switchable elements to switch to a non-conductive state in succession and to, after a predetermined period of time, control all of the second switchable elements to switch to a non-conductive state in succession.

39. A device for switching off a voltage supply of a plurality of voltage domains of a semiconductor circuit, the device comprising:
   a first switchable element and a second switchable element for each voltage domain, via which each voltage domain is connected to a supply voltage of the semiconductor circuit, wherein the driving capacity of the first switchable elements are greater than the driving capacity of the second switchable elements; and
   means for initially controlling all of the first switchable elements to switch to a non-conductive state in succession, and for controlling, after a period of time, all of the second switchable elements to switch to a non-conductive state in succession.

40. The device according to claim 39, wherein the first switchable elements configured to have driving capacities that increase more and more, the greater the corresponding amount is of a differential between the potential of the voltage supply of the corresponding voltage domain and the potential of the supply voltage of the semiconductor circuit.

* * * * *